United States Patent
Kaviani et al.

(10) Patent No.: US 9,417,807 B2
(45) Date of Patent: *Aug. 16, 2016

(54) DATA BUFFER WITH STROBE-BASED PRIMARY INTERFACE AND A STROBE-LESS SECONDARY INTERFACE

(71) Applicant: RAMBUS INC., Sunnyvale, CA (US)

(72) Inventors: Kambiz Kaviani, Palo Alto, CA (US); Amir Amirkhany, Sunnyvale, CA (US); Dinesh Patil, Sunnyvale, CA (US); Mohammad Hekmat, Mountain View, CA (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/820,207

(22) Filed: Aug. 6, 2015

(65) Prior Publication Data
US 2016/0041781 A1    Feb. 11, 2016

Related U.S. Application Data

(63) Continuation of application No. 14/028,172, filed on Sep. 16, 2013, now Pat. No. 9,158,679.

(60) Provisional application No. 61/712,197, filed on Oct. 10, 2012.

(51) Int. Cl.
| | | |
|---|---|---|
| G06F 12/00 | (2006.01) | |
| G06F 3/06 | (2006.01) | |
| G06F 12/02 | (2006.01) | |
| G11C 5/04 | (2006.01) | |
| G11C 7/10 | (2006.01) | |
| G06F 12/08 | (2016.01) | |

(52) U.S. Cl.
CPC ............ *G06F 3/0619* (2013.01); *G06F 3/0656* (2013.01); *G06F 3/0683* (2013.01); *G06F 12/0246* (2013.01); *G06F 12/0802* (2013.01); *G11C 5/04* (2013.01); *G11C 7/1066* (2013.01); *G11C 7/1093* (2013.01); *G06F 2212/20* (2013.01)

(58) Field of Classification Search
CPC .......................... G06F 12/0246; G11C 7/1093
USPC .................... 710/52, 53, 62; 711/105
See application file for complete search history.

(56) References Cited

U.S. PATENT DOCUMENTS

| | | |
|---|---|---|
| 6,971,039 B2 | 11/2005 | Krause et al. |
| 7,757,040 B2 | 7/2010 | Bellows et al. |

(Continued)

OTHER PUBLICATIONS

Daniels et al., "Take the LRDIMM Challenge to Boost Server Speed, Capacity," posted Apr. 11, 2012 on ElectronicDesign.com, http://electronicdesign.com/print/digital/lrdimm-challenge-boost-server-speed-capacity-73717. 4 pages.

Dell, "Addressing System Memory Challenges: Load-Reduced DIMMs," White Paper, Oct. 2009. 4 pages.

(Continued)

*Primary Examiner* — Tammara Peyton
(74) *Attorney, Agent, or Firm* — Lowenstein Sandler LLP

(57) ABSTRACT

A data buffer with a strobe-based primary interface and a strobe-less secondary interface used on a memory module is described. One memory module includes an address buffer, the data buffer and multiple dynamic random-access memory (DRAM) devices. The address buffer provides a timing reference to the data buffer and to the DRAM devices for one or more transactions between the data buffer and the DRAM devices via the strobe-less secondary interface.

20 Claims, 7 Drawing Sheets

(56) References Cited

U.S. PATENT DOCUMENTS

| | | |
|---|---|---|
| 7,986,584 B2 | 7/2011 | Tsern et al. |
| 9,158,679 B2 * | 10/2015 | Kaviani .............. G06F 12/0246 |
| 2008/0040562 A1 | 2/2008 | Gower et al. |
| 2008/0267267 A1 | 10/2008 | Lee |
| 2010/0162037 A1 | 6/2010 | Maule et al. |
| 2013/0346684 A1 | 12/2013 | Bains |

OTHER PUBLICATIONS

Inphi iMB Technology, "Increasing Computing Platform Efficiency Through Innovative Memory Architecture," White Paper, Updated Nov. 2, 2009. 9 pages.

MetaRAM Inc., "DDR2 MetaSDRAM RDIMM Product Brief," 2009. 2 pages.

Smart Modular Technologies, "SG1027RDR225663MEM," Mar. 7, 2008. 25 pages.

* cited by examiner

ND A STROBE-LESS
DATA BUFFER WITH STROBE-BASED PRIMARY INTERFACE AND A STROBE-LESS SECONDARY INTERFACE

RELATED APPLICATION

This application is a continuation application of U.S. patent application Ser. No. 14/028,172, filed Sep. 16, 2013, which claims the benefit of Provisional Application No. 61/712,197, filed Oct. 10, 2012, the entire contents of both are hereby incorporated by reference.

BACKGROUND

Enterprise servers are used in today's data centers, running various applications such as emails services, database queries, powering search engine operations, database management system (DBMS), customer relationship management (CRM), enterprise resource planning (ERP), or the like. Further, virtualized machines and various other collections computing systems are being used for remote computing, also referred to as cloud computing. All of these services, whether on physical or virtual servers, use a great amount of memory resources, as well as bandwidth. These physical or virtual machines could also be personal computers.

Computing memory systems are generally composed of one or more dynamic random access memory (DRAM) integrated circuits, referred to herein as DRAM devices, which are connected to one or more processors. Multiple DRAM devices may be arranged on a memory module, such as a dual in-line memory module (DIMM). A DIMM includes a series of DRAM devices mounted on a printed circuit board (PCB) and are typically designed for use in personal computers, workstations, servers, or the like. Memory capacity may be limited by the loading of the data query (DQ) bus and the request query (RQ) bus associated with the use of many DRAM devices and DIMMs. Memory modules can have a buffer between the DRAM devices and the system's memory controller to increase the number of DIMMs and therefore increase the memory capacity of the system. For example, a fully buffered DIMM architecture introduces an advanced memory buffer (AMB) between the memory controller and the DRAM devices on the DIMM. The memory controller communicates with the AMB as if the AMB were a memory device, and the AMB communicates with the DRAM devices as if the AMB were a memory controller. The AMB can buffer data, command and address signals. With this architecture, the memory controller does not write to the DRAM devices, rather the AMB writes to the DRAM devices. This architecture introduces latency to the memory request and increases power consumption for the AMB. Registered DIMM (RDIMM) architecture, on the other hand, enables moderate increase in capacity with lower latency by using a buffer between the DRAM modules and the system's memory controller only on the RQ bus. Load reduced DIMM (LRDIMM) architecture uses buffers on both RQ and DQ buses for increased capacity and moderate latency. All these architectures, place less electrical load on the memory controller and allow single systems to remain stable with more memory modules than they would have otherwise. These architectures are often more expensive because of the lower demand on high-capacity as well as the additional components on the DIMM, so it is usually found only in applications where the need for scalability and stability outweighs the need for a low price (servers, for example).

BRIEF DESCRIPTION OF THE DRAWINGS

The present embodiments are illustrated by way of example, and not of limitation, in the figures of the accompanying drawings in which.

DETAILED DESCRIPTION

Figure 1:
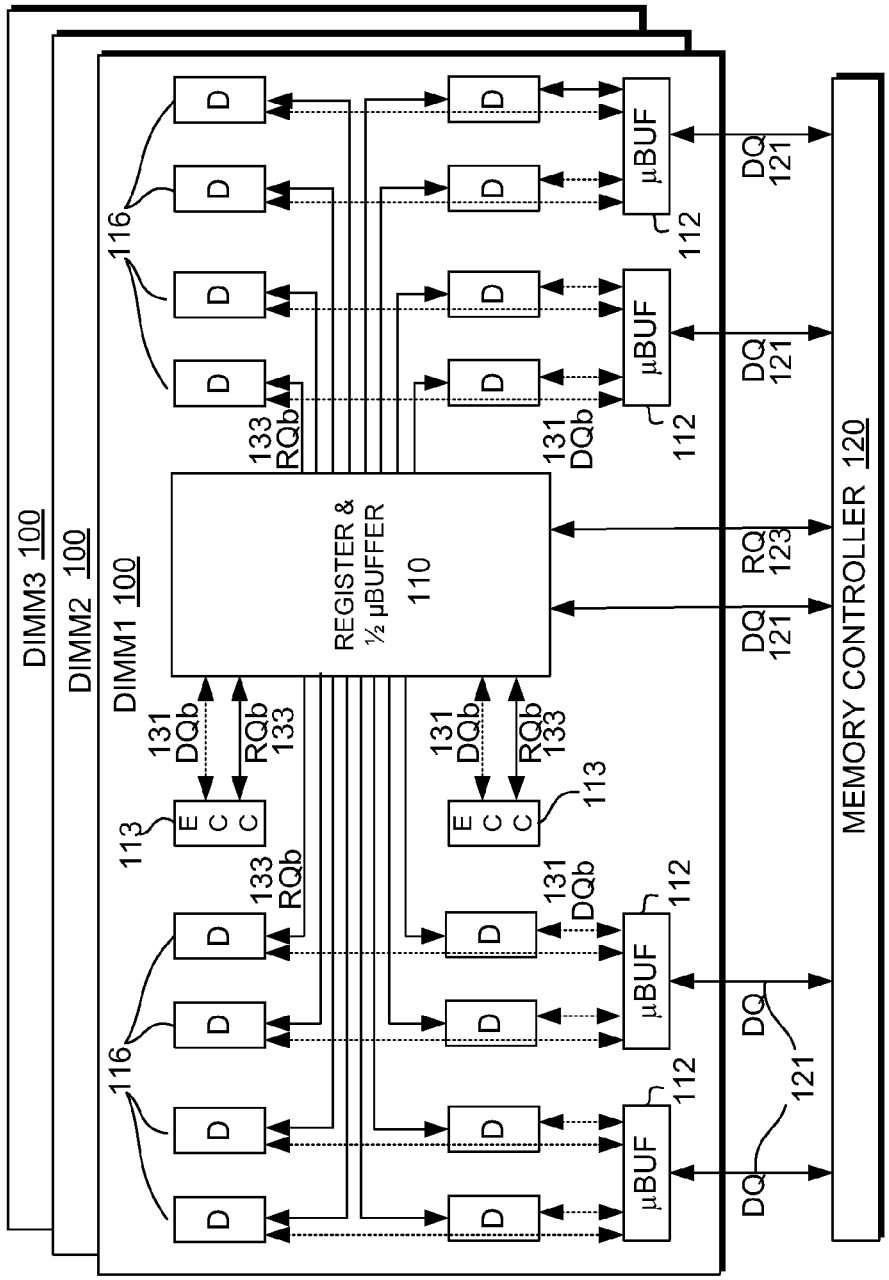
FIG. 1 is a block diagram illustrating a memory-buffer architecture with distributed data buffers on each DIMM according to one implementation.

Current memory interfaces for central processing units (CPUs) have a limitation on memory capacity and bandwidth. Exceeding that limit diminishes the integrity of the data transfer between the CPU and memory components due to the loading of multiple memory devices on both data and address buses. As CPUs require to process data faster, the ability to communicate with more memory actually decreases. One solution is to use memory-buffer architecture to improve the integrity of the data transfer by amplifying and relaying the signal in between the CPU and memory devices as illustrated in FIG. 1. The memory-buffer architecture, such as LRDIMM, allows for increased DRAM devices in a memory module as well as increased number of DIMMs for larger capacity, while operating at comparable frequencies as low-capacity solutions.

FIG. 1 is a block diagram illustrating a memory-buffer architecture with distributed data buffers on each DIMM according to one implementation. The memory architecture includes three DIMMs 100 coupled to a memory controller 120. Each of the DIMMs 100 include a register and data buffer 110, multiple distributed data buffers 112 (labeled as µ buffer), and multiple DRAM devices 116. The register and data buffer 110 and distributed data buffers 112 are coupled between the DRAM devices 116 and the memory controller 120 to buffer the data signals. In particular, the register and data buffer 110 and distributed data buffers 112 are coupled to receive data signals from the memory controller 120 via the data bus (DQ) 121 and the request bus (RQ) 123, and provide data signals to the DRAM device 116 on the buffered data bus (DQb) 131 and the buffered request bus (RQb) 133. In one implementation, the register and data buffer 110 and distributed data buffers 112 reside in a data buffer device having a common carrier substrate such as, for example, an integrated circuit ("IC") die substrate, a multi-chip module substrate, or the like. Alternatively, the register and data buffer 110 and distributed data buffers 110 may be one or more separate integrated circuits and/or discrete components. In another implementation, the register and data buffer 110 reside in a data buffer device and the distributed data buffers 112 reside on one or more separate data buffer devices.

In another implementation, a centralized buffer without distributed data buffers 112 may be used but may be limited in speed due to the increased routing to the centralized buffer. Referring back to FIG. 1, the register and data buffer 110 is used to buffer the RQ 123, and the distributed data buffers 112 are used to buffer the DQ 121. The number of distributed data buffers 112 may depend upon the number of buffered DRAM devices 116. In the depicted implementation, one distributed data buffer 112 is used per four DRAM devices 116 with a one-half (½) data buffer in the register and data buffer 110 for error correction codes (ECC) DRAM 113. Alternatively, other groupings of distributed data buffers 112 to DRAM devices 116 may be used as would be appreciated by one of ordinary skill in the art having the benefit of this disclosure.

While buffering can increase the capacity of the DIMM 100, the power overhead can limit the performance of the electronic system in which the DIMM is used. A data buffer device on a DIMM 100 has a primary interface coupled to the memory controller 120 and a secondary interface coupled to the DRAM device 116. The data buffer device can isolate the secondary interface, also referred to herein as a memory interface while the primary interface may be referred to as the controller interface. Since the secondary interface can be isolated, the DRAM devices can be optimized regardless of the existing controllers and there are opportunities for power or area optimizations as described herein. The secondary interface may be point-to-point or point-to-multi-point, and the primary interface is stubbed for multiple DIMMs 100. The speed can be the same for both the primary interface and the secondary interface or can be different to save area or power on the DRAM device. However, one signaling solution may not be optimal for both the primary interface and the secondary interface. For example, DDR3 and DDR4 interfaces are strobe-based interfaces. When using DDR3 or DDR4 DRAM devices in servers, they are typically organized as in multiples of by-four (×4) devices for increased capacity. The DQ bus in a ×4 configuration includes a differential strobe signal with 100% signaling activity. The strobe power overhead is therefore 100% because a differential strobe for ×4 configuration is twice the data signaling activity. By buffering the DRAM devices 116 from the memory controller 120, the strobe can be eliminated on the secondary interface, as described in the embodiments below. However, in order to handle transactions on the secondary interface, the following embodiments are described to create a strobe-less secondary interface between the DRAM devices 116 and the data buffers.

Figure 2:
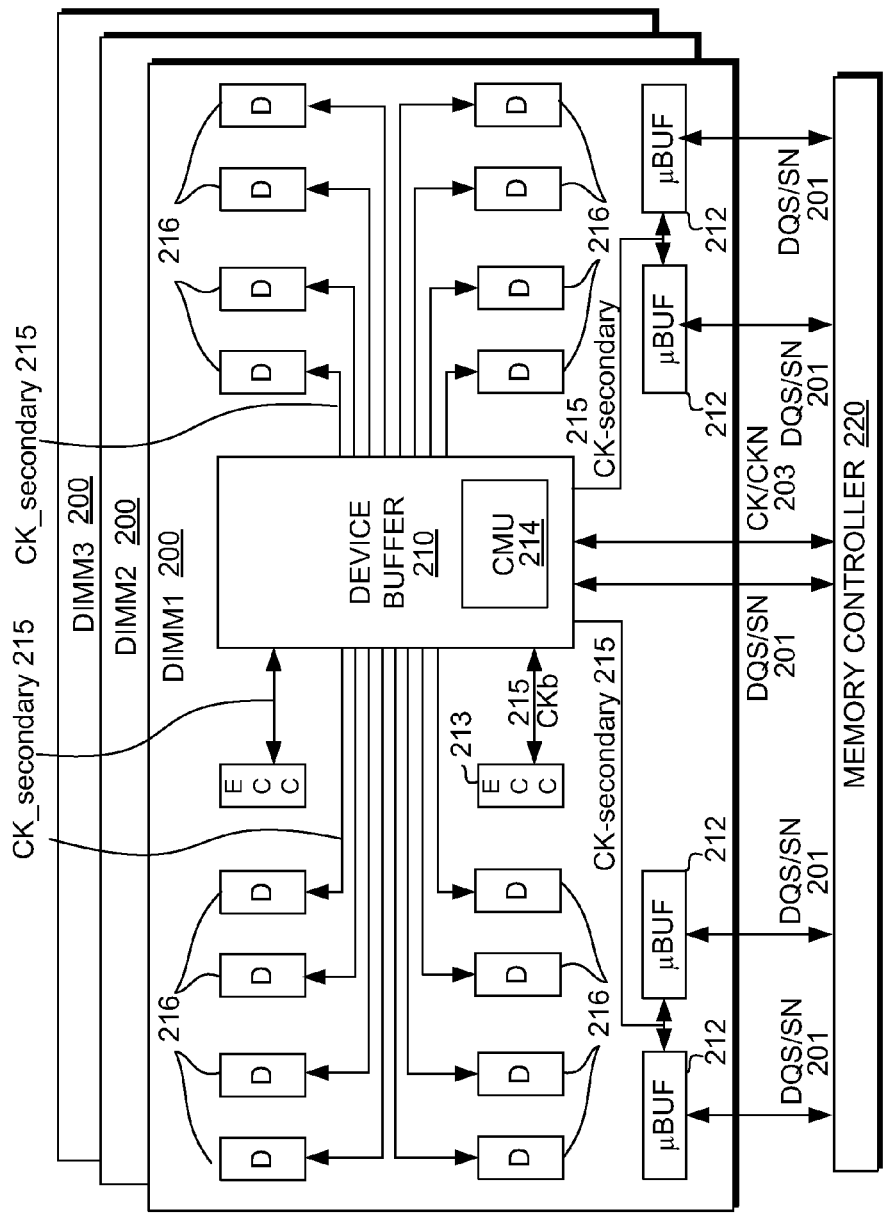
FIG. 2 is a block diagram illustrating a memory-buffer architecture with distributed data buffers with forwarded clocking architecture according to one embodiment.

FIG. 2 is a block diagram illustrating a memory-buffer architecture with distributed data buffers with forwarded clocking architecture according to one embodiment. The memory architecture includes three DIMMs 200 coupled to a memory controller 220. Each of the DIMMs 200 include a buffer device 210, multiple distributed data buffers 212 (labeled as μ buffer), and multiple DRAM devices 216. The buffer device 210 and distributed data buffers 212 are coupled between the DRAM devices 216 and the memory controller 220 to buffer the data signals. The buffer device 210 and distributed data buffers 212 are coupled to receive a data bus strobe signal (DQS/DQSN) 201 and a clock signal (CK/CKN) 203. Although not illustrated, the buffer device 210 and distributed data buffers 212 also are coupled to DQ bus and the RQ bus described above with respect to FIG. 1. Instead of providing the DQS signal 201 and the clock signal 203, the buffer device 210 generates a new clock signal (CK_secondary) 215 to forward to the DRAM devices 216 and the distributed data buffers 212.

In one embodiment, the buffer device 210 includes a clock frequency multiplication unit (CMU) 214 configured to generate a clock signal 215 (CK_secondary) as a timing reference for the secondary interface between the data buffers 212 and the DRAM devices 216. The CMU 214 can receive the clock signal 203 from the memory controller 220 and frequency-multiply (e.g., scale a frequency of the reference clock, including scaling up by multiplication and scaling down by division) the clock signal to generate the clock signal 215. The buffer device 210 forwards the clock signal 215 to the distributed data buffers 212 and the DRAM devices 216, and to the ECC blocks 213 when present. In one embodiment, the data buffer device 214 uses differential signaling to forward the clock signal to the distributed data buffers 212 and the DRAM devices 216. Differential signal is a method of transmitting information with two complementary signals sent on two paired transmission lines, called a differential pair. Differential signaling can be used to help reduce noise and crosstalk on the DIMM module due to the presence of multiple data and request buses. Alternatively, other types of signaling may be used, such as single-ended signaling to reduce the power for low-power applications. The distributed data buffers 212 use the clock signal 215 to control timing of transactions on the secondary interface between the DRAM devices 216 and the distributed data buffers 212. The secondary interface is a strobe-less interface, while the primary interface is a strobe-based interface that uses the DQS signal 201 for controlling timing of transactions on the primary interface between the distributed data buffers 212 and the memory controller 220. In one embodiment, a distributed data buffer 212 receives a strobe signal 201 from the memory controller 220 via the primary interface, and the strobe signal is not forwarded on the secondary interface by the distributed data buffer 212.

In one embodiment, the buffer device 210 includes a register for buffering the RQ bus (also referred to herein as command/address (CA) bus) in addition to the CMU 214, which is used for clock buffering. In one embodiment, components of the buffer device 210 reside on a common carrier substrate, and the distributed data buffers reside on one or more separate common carrier substrates. These devices are disposed on the DIMMs 200 along with the DRAM devices 216. Alternatively, the components described herein may be implemented on the DIMMs 100 in other configurations as would be appreciated by one of ordinary skill in the art having the benefit of this disclosure.

The depicted embodiment of FIG. 2 illustrates a point-to-point clock forwarding architecture for both the data bus and the request bus to enable fast clock gating to minimize power consumption on the DRAM devices 216, the buffer device 210 and the distributed data buffers 212. The buffer device 210 can be a centrally located register with the CMU 214, which generates the required clock on the DIMM 200. The clock signal may be forwarded to all DRAM devices and distributed data buffers 212 differentially with matched routings and terminated impedance fashion to maintain the integrity of its signals. A point-to-point on the clock signal may provide improved speed performance, as well as savings on power with gating features. However, in other embodiments, the clock signal may be implemented in other configurations to save area or pins as would be appreciated by one of ordinary skill in the art having the benefit of this disclosure.

In the depicted embodiment, the DRAM devices 216 are arranged that each point represent a dedicated rank. A dedicated rank is a set of DRAM devices connected to the same chip select, and which are accessed simultaneously. The address buffer can be configured to share the clock signal 215 to the DRAM devices in the rank as a dedicated forwarded clock signal. Similarly, the data buffer bus can be gated according to ranks. This configuration enables clock gating for inactive ranks and reduces the consumed power by the DIMM 200. The address buffer can include clock-gating circuitry to enable the clock gating of the clock signals to one or more of the ranks that are inactive. Since at any time only one DIMM 200 is active, the DRAM devices and data buffers on inactive DIMMs can be turned off. In a further embodiment, the clock generation scheme shown in FIG. 3 can be used to further reduce the power of the whole system.

Figure 3:
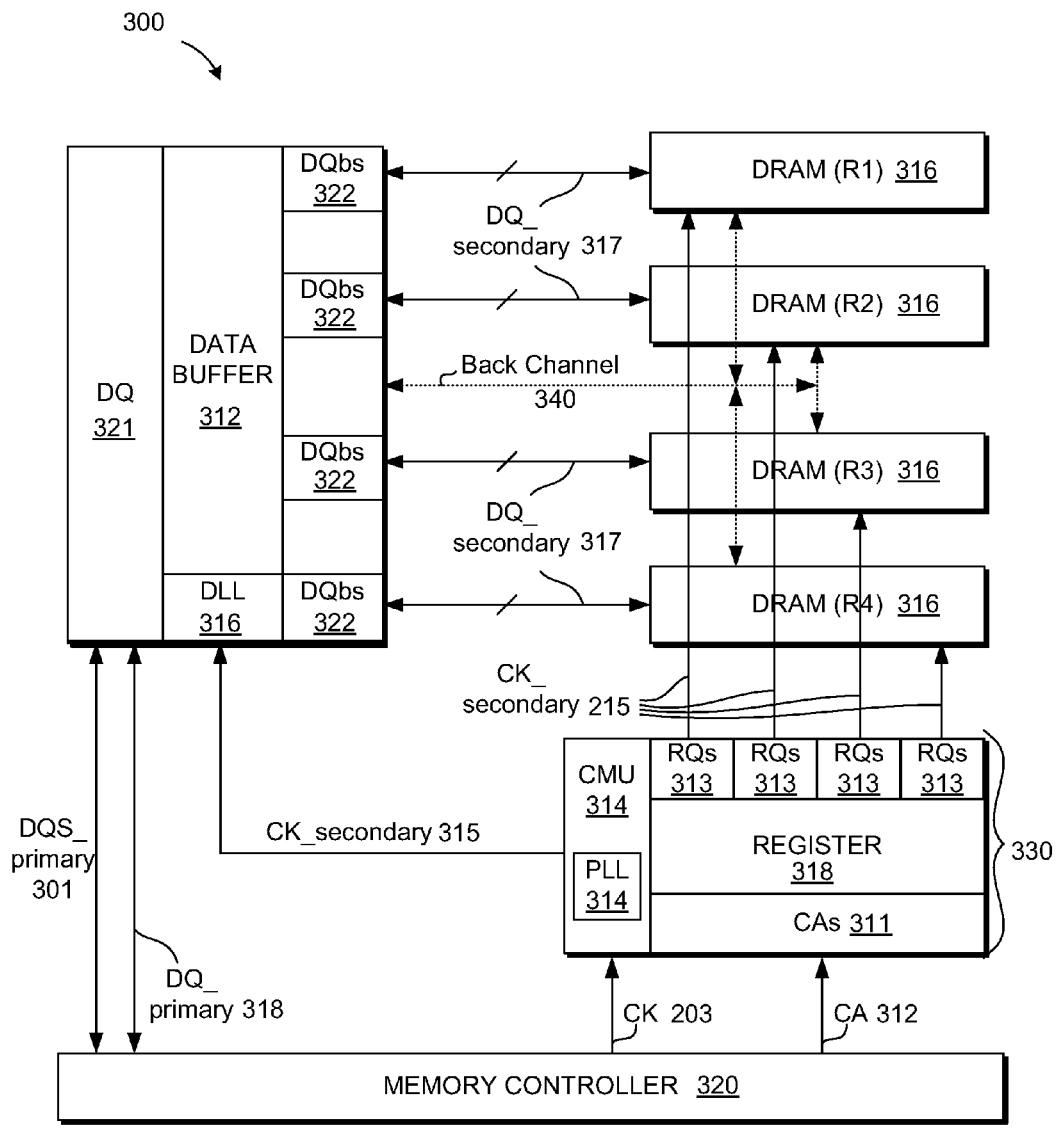
FIG. 3 is a block diagram illustrating a high-performance clocking scheme according to one embodiment.

FIG. 3 is a block diagram illustrating a high-performance clocking scheme 300 according to one embodiment. The high-performance clocking scheme 300 includes a buffer device 330 and a data buffer 312, such as one of the distributed data buffers 312 in FIG. 2 or a data buffer in the buffer device 310. The buffer device 330 includes a register 318, a primary CA interface 311, a secondary RQ interface 313 and the CMU 314, which includes a phase-locked loop (PLL) 314. The register 318 is configured to receive command/address (CA) signals 312 on the primary CA interface 311 bus 311. The register 318 buffers the CA signals 312 and provides the appropriate CA signals to the DRAM devices 315 on the secondary RQ interface 313. The PLL 314 is configured to receive the clock signal 303 from the memory controller 320 on the primary interface (i.e., controller interface), generate a secondary clock signal 315, and forward the secondary clock signal 315 to the data buffer 312 and the DRAM devices 316 on the secondary interface (i.e., memory interface).

The data buffer 312 includes a primary interface (DQ) 313 to communicate with the memory controller 320, such as to send and receive DQS signals 301 and the data signals 318 (DQ_primary) to and from the memory controller 320. The data buffer 312 also includes a secondary interface (DQbs) 322 to communicate with the DRAM devices 316, such as to send and receive data signals 317 (DQ_secondary). The data buffer 312 also includes a delay-locked loop (DLL) configured to receive the forwarded clock signal 315 (CK_secondary) from the CMU 314 of the buffer device 330. The data buffer 312 uses the forwarded clock signal 315 to control timing of transactions on the primary and secondary interfaces between the controller 320 and DRAM devices 315 to and from the data buffer 312.

In the depicted embodiment, the data buffer 312 receives a strobe signal DQS 301 from the memory controller 320, but does not forward or use the strobe signal DQS 201 on the secondary interface for the transactions between the data buffer 312 and the DRAM devices 316. This allows the secondary interface to be a strobe-less interface.

In another embodiment, the buffer device 330 is an address buffer that includes the CMU 314. The address buffer is coupled to memory controller 320 via a controller interface and is coupled to the DRAM devices 316 via a memory interface. The address buffer is configured to provide a timing reference to the data buffer 312 for one or more transactions between the data buffer 312 and the DRAM devices 316 via the memory interface. In one embodiment, the CMU 314 of the address buffer is configured to generate a clock signal as the timing reference for the memory interface. In one embodiment, the address buffer forwards the clock signal 315 to the DRAM devices 316 and the data buffer 312 using differential signaling. In another embodiment, the address buffer forwards the clock signal 315 using single-ended signaling.

As described above, to further reduce the power, the clock generation scheme in FIG. 3 can be used. Since at any time only one DIMM 200 is active, the DRAM devices 316 and the data buffers 312 on inactive DIMMs 200 can be turned off.

The data buffers, and potentially the DRAM devices themselves, may incorporate a fast wake-up/power-down DLL to maintain a fixed latency across the data buffer 312 (or the DRAM device 316) while saving power during transition times between power-on and power-off states while the corresponding DIMM is not active or is in between multiple uses. Also, as described herein, since the buffer device 330 shares a dedicated forwarded clock signal to both the DRAM devices 316 and the data buffers 312, the conventional strobe based signals are eliminated on the secondary interface (i.e., memory interface). The DLLs on the DRAM devices 316 assume that the clocking performance is maintained through the whole READ and WRITE paths within DRAM devices 316 and data buffers 312 during each transaction. In one embodiment, the clocking performance can be well maintained by incorporating a low-noise LC phase-locked loop (PLL) in the buffer device 310 and current-mode logic (CML) distribution on the DRAM devices 316 and the data buffers 312.

In a further embodiment, as depicted in FIG. 3, to further suppress timing drifts due to temperature and voltage slow variations, a back channel 340 can be used for initial calibration, periodic calibration, or both. The calibration results can be shared among ranks for cost reduction. The back channel 340 may be an extra low-speed channel that used during calibration to send out the pass or fail condition back to the data buffer 312 so that the data buffer 312 adjusts its timing. The back channel 340 can be dedicated or shared between the DRAM devices 316 so that it can be used in sequence to calibrate all devices timing one after the other in sequence.

In another embodiment, a data buffer device includes a controller interface to communicate with the memory controller, a memory interface to communicate with DRAM devices, and a CMU. The controller interface is a strobe-based interface and the memory interface is a strobe-less interface. The CMU is configured to scale the frequency of a reference clock received from the memory controller via the controller interface, and distribute the scaled-frequency clock to one or more distributed data buffers and one or more DRAM devices for transactions between the distributed data buffers and the DRAM devices on the memory interface.

In a further embodiment, the data buffer device includes a register 318 that includes the CMU 314 and a data buffer 312. The CMU 314 includes a low-noise LC PLL coupled to receive the reference clock from the memory controller 320 and to generate the scaled-frequency clock (e.g., CK_secondary 315) to the data buffer 312 and the DRAM devices 316. The register 318 is configured to receive command and address (CA) signals from the memory controller 320 via the controller interface. The data buffer 312 includes the power-up DLL 316 coupled to receive the scaled-frequency clock. In one embodiment, the data buffer 312 includes the circuitry illustrated and described with respect to FIG. 4 for READ operations and the circuitry illustrated and described with respect to FIG. 5 for WRITE operations.

Figure 4:
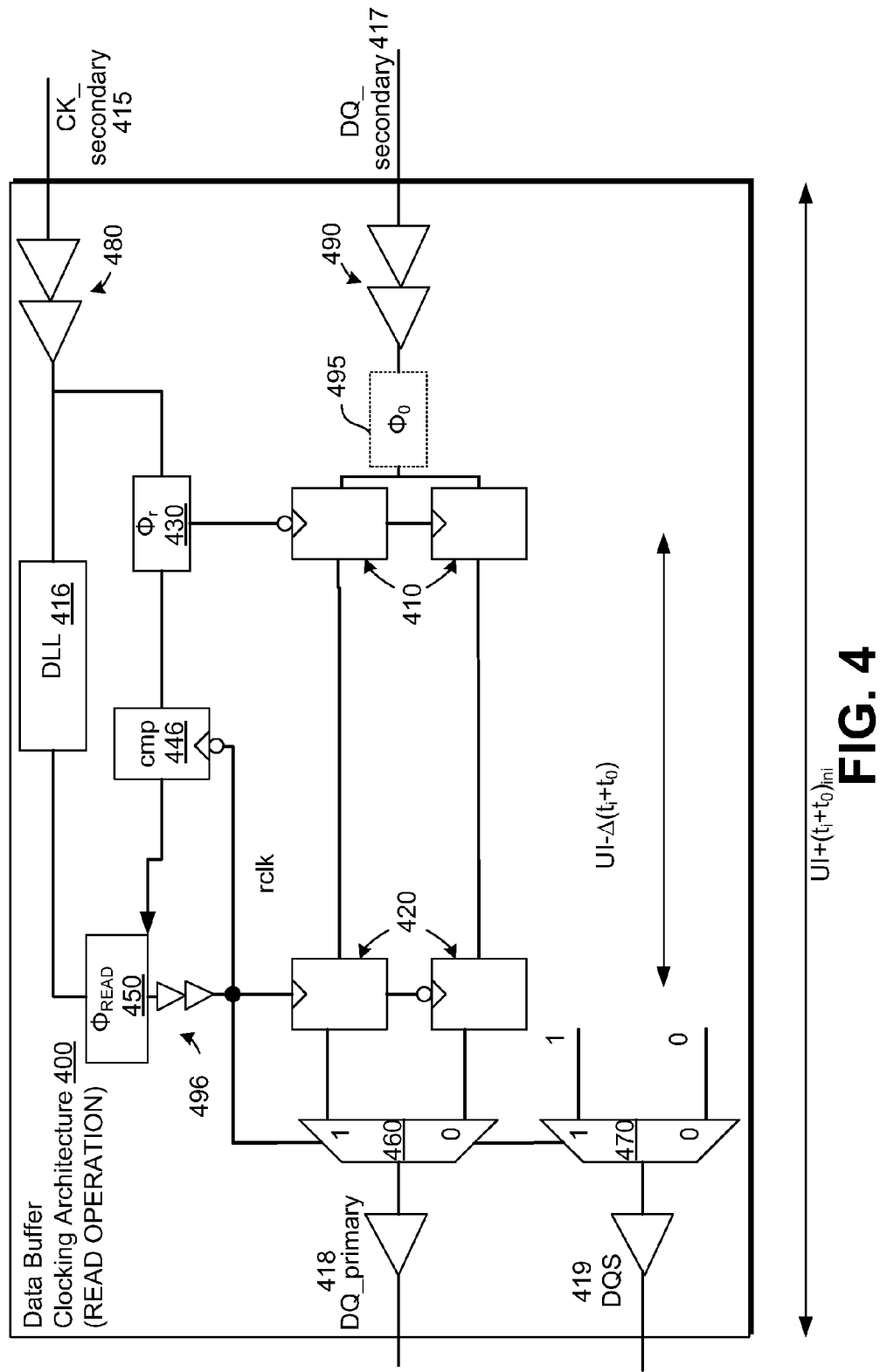
FIG. 4 is a block diagram illustrating a data buffer clocking architecture for read operations according to one embodiment.

FIG. 4 is a block diagram illustrating a data buffer clocking architecture 400 for read operations according to one embodiment. The data buffer 412 includes a first pair of flip-flops 410 coupled to receive a data signal 417 (DQ_secondary), during a READ operation, from one of the plurality of DRAM devices 416 on a secondary interface. The secondary interface is between the data buffer 412 and the DRAM devices 416. The data buffer 412 includes a first phase adjuster 430 coupled to receive the forwarded clock signal 415 from the buffer device 410. The first phase adjuster 430 is configured to control first samplings of the data signal 417 at the first pair of flip-flops 410. In this embodiment, a pair of flip-flops 410 are used for DDR, however, in other embodiments, a single or multiple flip-flops can be used in other applications. The data buffer 412 further includes a second pair of flip-flops 420 coupled to corresponding outputs of the first pair of flip-flops 410. A DLL 416 is configured to receive the forwarded clock signal 415 from the buffer device. A comparator 440 is coupled to an output of the first phase adjuster 430. A second phase adjuster 450 is coupled to an output of the DLL 416 and an output of the comparator 440. The second phase adjuster 450 is configured to control second samplings of the data signal at the second pair of flip-flops 420. A first multiplexer 460 is coupled to outputs of the second pair of flip-flops 420 and controlled by the output of the second phase adjuster 450. The first multiplexer 460 is configured to output the data signal 418 (DQ_primary) to the memory controller 420 on the primary interface. A second multiplexer 470 is configured to output a strobe signal 419 (DQS) to the memory controller 412 on the primary interface based on the second phase adjuster clock timing. The first phase adjuster 430 is configurable to calibrate a read transaction on the secondary interface, and the second phase adjuster 450 is configurable to calibrate data transfer between the first pair of flip-flops 410 and the second pair of flip-flops 420 with sufficient timing margin. The data buffer clocking architecture 400 provides an entire delay as expressed as $UI+(t_i+t_o)_{ini}$ where $t_i+t_o$ is the total delay of the input and output (IO) blocks.

In the depicted embodiment, the clock signal 415 (CK_secondary) received from the DRAM device 416 at the DLL 416 and the first phase adjuster 430 is buffered using buffer amplifiers 480. The buffer amplifiers 480 provide electrical impedance transformation from one circuit to another. Similarly, the data signal 417 (DQ_secondary) received from the DRAM device 416 at the first pair of flip-flops 410 is buffered using buffer amplifiers 490. In a further embodiment, a third phase adjuster 495 can be used on the input of the first pair of flip-flops 410. The third phase adjuster 495 may be in a fixed phase state to budget for the voltage and timing variation of the phase adjuster 430. The output of the second phase adjuster 450 can be buffered using clocking buffers 496. The clocking buffers 496 may be CML or CMOS. The delay of the clocking buffers 496 may be compensated for in the DLL.

The first phase adjuster 430 can be used to calibrate the secondary READ operation, and the second phase adjuster 430 can be used to fix the data transfer between the flip-flops. These adjustments may be an initial calibration, a periodic calibration or both. It should also be noted that the clock signal 415 (CK_secondary) and the strobe signal DQS 419 remain in fixed phase, but may not necessarily be aligned.

Figure 5:
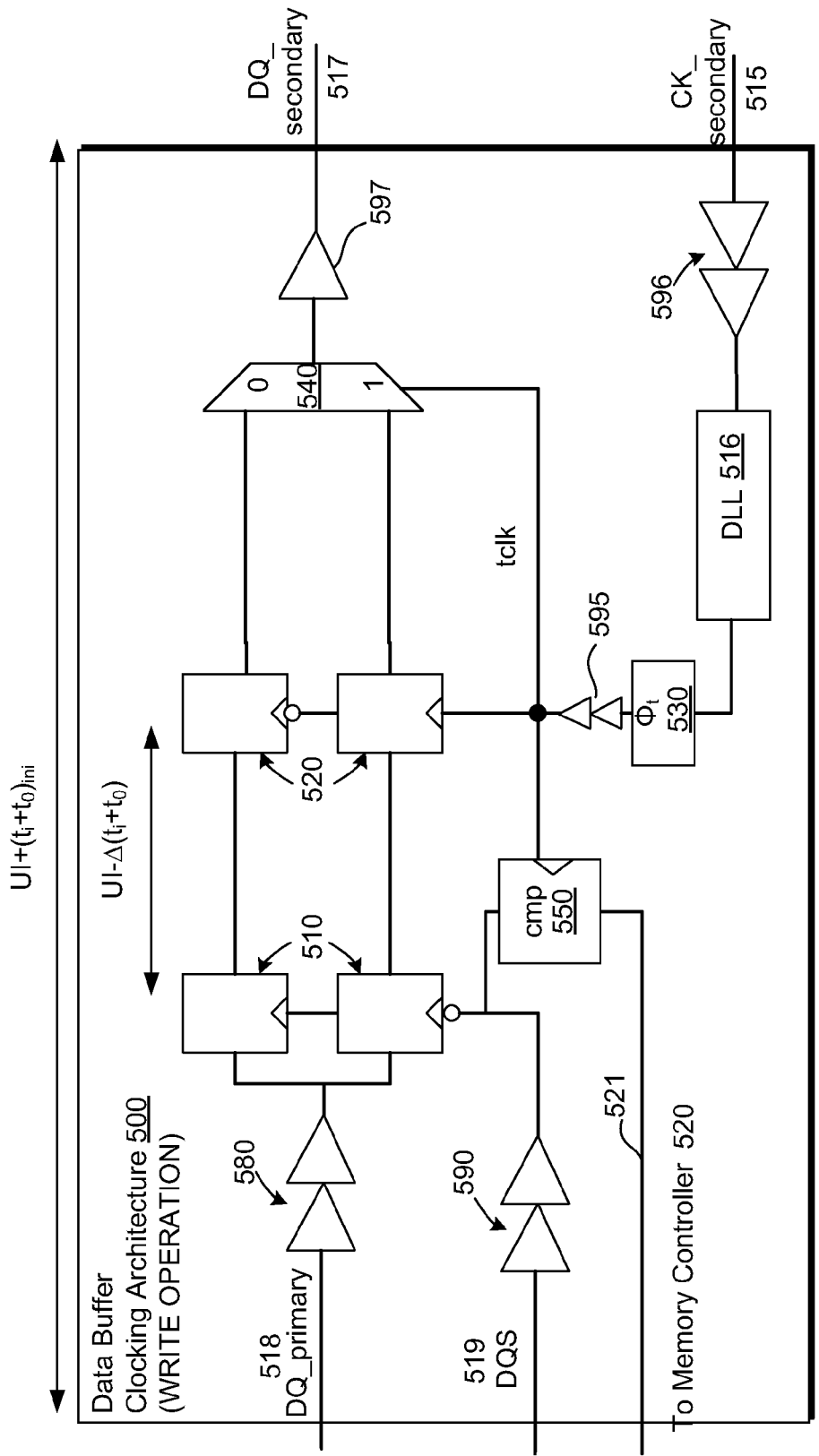
FIG. 5 is a block diagram illustrating a data buffer clocking architecture for write operations according to one embodiment.

FIG. 5 is a block diagram illustrating a data buffer clocking architecture 500 for write operations according to one embodiment. The data buffer 512 includes a first pair of flip-flops 510 coupled to receive a data signal 518 (DQ_primary) from the memory controller 520 on the primary interface. The first pair of flip-flops 510 is controlled by a strobe signal 519 (DQS) received from the memory controller 520 on the primary interface. In this embodiment, a pair of flip-flops 410 are used for DDR, however, in other embodiments, a single or multiple flip-flops can be used in other applications. A second pair of flip-flops 520 coupled to receive the data signal from outputs of the first pair of flip-flops 510. A DLL 516 is configured to receive the forwarded clock signal 515 from the buffer device 510. A phase adjuster 530 is coupled to an output of the DLL 516. The phase adjuster 516 is configured, in a WRITE operation, to calibrate timing of the second pair of flip-flops 520 such that the data signal output by the second pair 520 of flip-flops on a secondary interface between the data buffer 512 and the DRAM device 516 is sampled by the DRAM device in a middle of a sampling window (e.g., "middle of the eye").

In a further embodiment, a multiplexer 540 is coupled to outputs of the second pair of flip-flops 520. The multiplexer 540 is configured to output the data signal to the DRAM device on the secondary interface. The multiplexer 540 is controlled by the output of the phase adjuster 530. In a further embodiment, a comparator 550 is coupled to receive the strobe signal 519 (DQS) and the output of the phase adjuster 530. The comparator 550 provides a control signal 521 to the memory controller 220 that allows calibration of the strobe signal with respect to the WRITE clock (tclk) of the data buffer 512. The WRITE clock (tclk) can be used to send data to the DRAM device on the secondary interface.

In the depicted embodiment, the data signals 518 received from the memory controller 520 at the first pair of flip-flops 510 is buffered using buffer amplifiers 580. The strobe signal 519 received from the memory controller 520 is also buffered using buffer amplifiers 590. The forwarded clock signal 515 received from the buffer device 510 at the DLL 516 is buffered using buffer amplifiers 596. In the depicted embodiment, the data buffer 512 can adjust the phase of tclk that controls the multiplexer 540 to calibrate the secondary WRITE operation. The output of the phase adjuster can also be buffered using clocking buffers 595. The clocking buffers 595 may be CML or CMOS. The delay of the clocking buffers 595 may be compensated for in the DLL. The memory controller 220 can adjust the strobe signal 519 (DQS) and the data signal 518 (DQ_primary) phases to account for clock domain crossing to the calibrated tclk domain.

Figure 6:
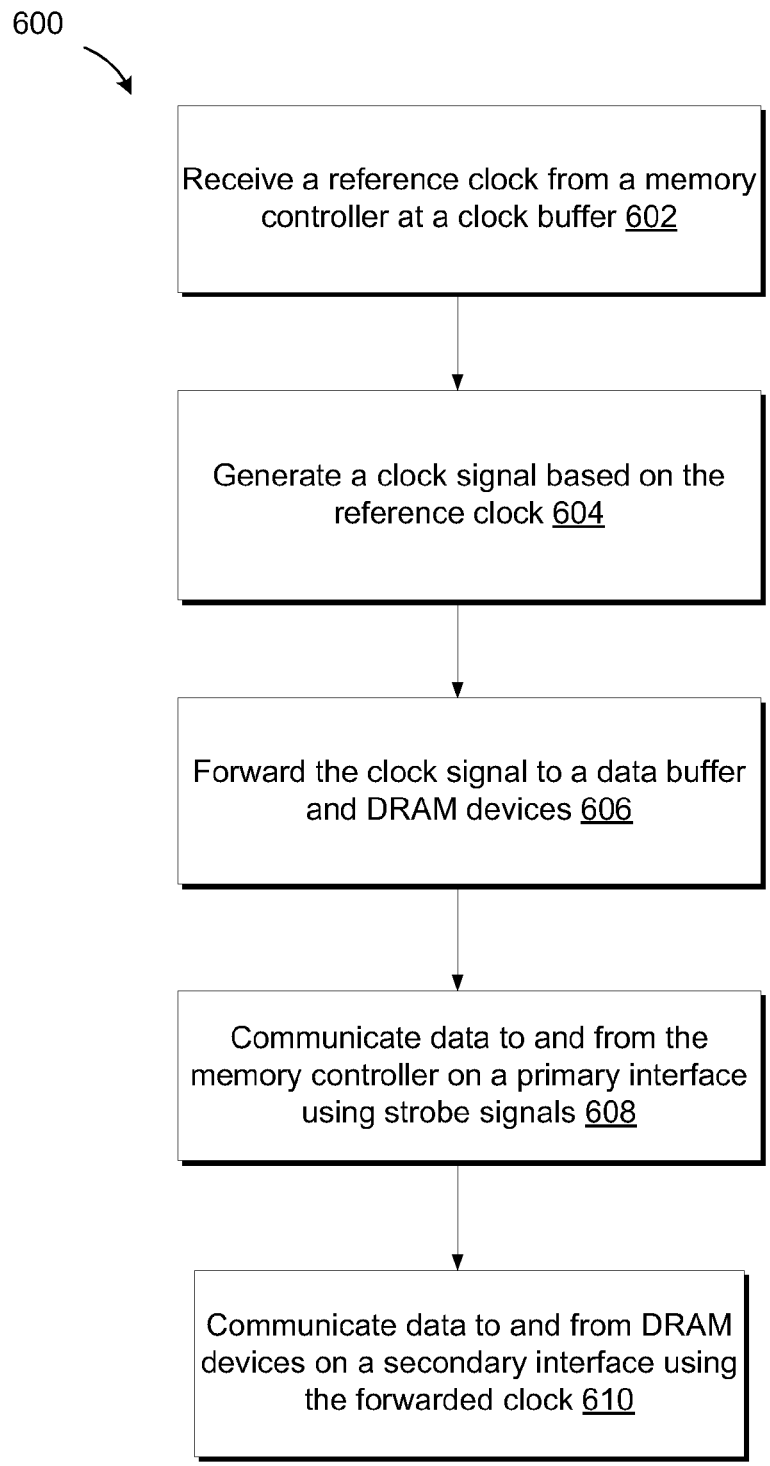
FIG. 6 is a flow diagram of a method of operating a data buffer clocking architecture according to an embodiment.

FIG. 6 is a flow diagram of a method 600 of operating a data buffer clocking architecture according to an embodiment. The method 600 begins with receiving a reference clock from a memory controller at a buffer device (block 602), such as a register having the CMU, an address buffer having the CMU, or the like, as described herein. The buffer device generates a clock signal based on the reference clock (block 604), and forwards the clock signal to a data buffer and DRAM devices (block 606). Data is communicated to and from the memory controller on a primary interface of the data buffer using strobe signals (block 608), and data is communicated to and from the DRAM devices on a secondary interface of the data buffer using the forwarded clock (block 610).

In a further embodiment, the data buffer receives data signals and strobe signals from the memory controller via the primary interface during a write transaction, and the data buffer provides the data signal on the secondary interface without forwarding the strobe signal. The timing of the write transaction on the secondary interface is controlled by the forwarded clock signal.

Figure 7:
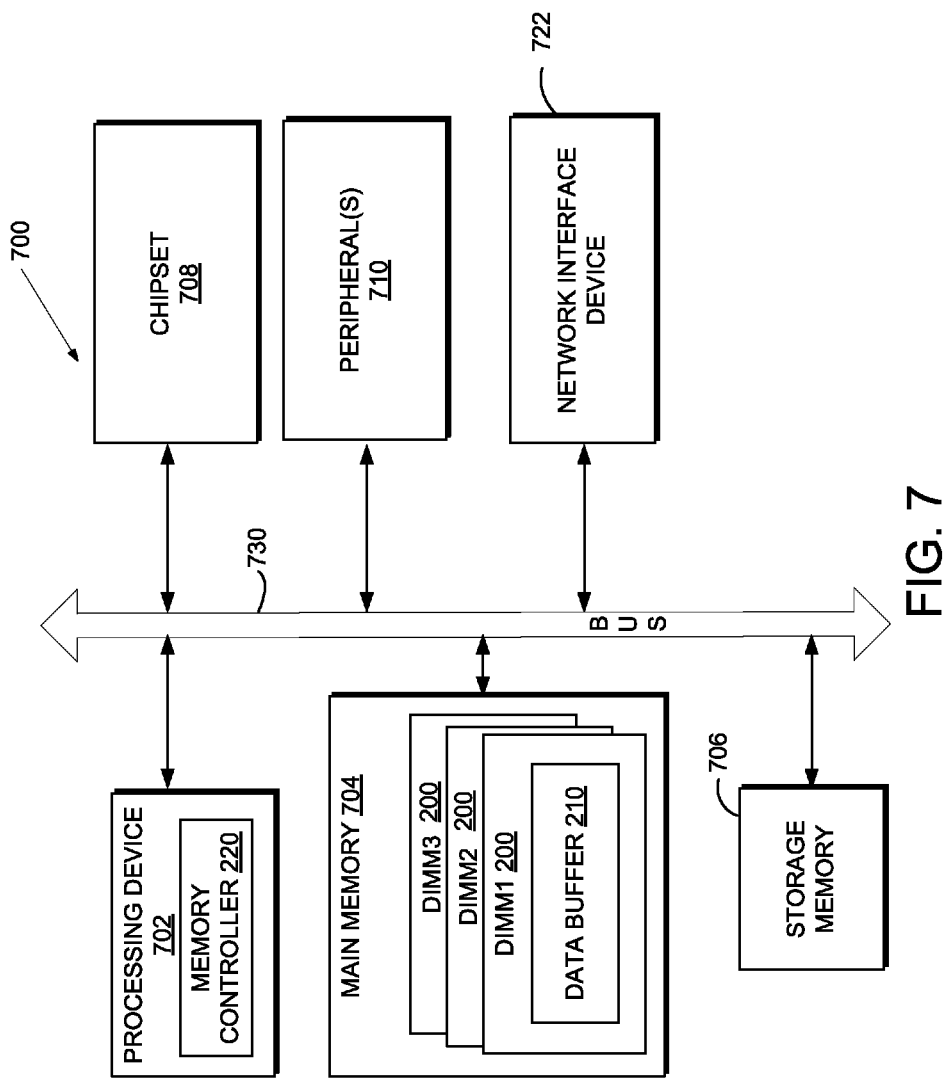
FIG. 7 is a diagram of one embodiment of a computer system, including main memory with a data buffer clocking architecture according to one embodiment.

FIG. 7 is a diagram of one embodiment of a computer system 700, including main memory 700 with a data buffer clocking architecture according to one embodiment. The computer system 700 may be connected (e.g., networked) to other machines in a LAN, an intranet, an extranet, or the Internet. The computer system 700 can be a host in a cloud, a cloud provider system, a cloud controller, a server, a client, or any other machine. The computer system 700 can operate in the capacity of a server or a client machine in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The computer system 700 includes a processing device 702 (e.g., host processor 150 or processing device 110 of FIG. 1), a main memory 704 (e.g., read-only memory (ROM), flash memory, dynamic random access memory (DRAM), a storage memory 706 (e.g., flash memory, static random access memory (SRAM), etc.), and a secondary memory 718 (e.g., a data storage device in the form of a drive unit, which may include fixed or removable computer-readable storage medium), which communicate with each other via a bus 730. The main memory 704 includes the data buffer clocking architecture as described above with respect to FIGS. 2-6.

Processing device 702 represents one or more general-purpose processing devices such as a microprocessor, central processing unit, or the like. More particularly, the processing device 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. Processing device 702 includes a memory controller 220 as described above. The memory controller 220 is a digital circuit that manages the flow of data going to and from the main memory 704. The memory controller 220 can be a separate integrated circuit, but can also be implemented on the die of a microprocessor.

In one embodiment, the processing device 702 may reside on a first integrated circuit and the main memory 704 may reside on a second integrated circuit. For example, the integrated circuit may include a host computer (e.g., CPU having one more processing cores, L1 caches, L2 caches, or the like), a host controller or other types of processing devices 702. The second integrated circuit may include a memory device coupled to the host device, and whose primary functionality is dependent upon the host device, and can therefore be considered as expanding the host device's capabilities, while not forming part of the host device's core architecture. The memory device may be capable of communicating with the host device via a DQ bus and a CA bus. For example, the memory device may be a single chip or a multi-chip module including any combination of single chip devices on a common integrated circuit substrate. The components of FIG. 7 can reside on "a common carrier substrate," such as, for example, an integrated circuit ("IC") die substrate, a multi-chip module substrate or the like. Alternatively, the memory device may reside on one or more printed circuit boards, such as, for example, a mother board, a daughter board or other type of circuit card. In other implementations, the main memory and processing device 702 can reside on the same or different carrier substrates.

The computer system 700 may include a chipset 708, which refers to a group of integrated circuits, or chips, that are designed to work with the processing device 702 and controls communications between the processing device 702 and external devices. For example, the chipset 708 may be a set of chips on a motherboard that links the processing device 702 to very high-speed devices, such as main memory 708 and graphic controllers, as well as linking the processing device to lower-speed peripheral buses of peripherals 710, such as USB, PCI or ISA buses.

The computer system 700 may further include a network interface device 722. The computer system 700 also may include a video display unit (e.g., a liquid crystal display (LCD)) connected to the computer system through a graphics port and graphics chipset, an alphanumeric input device (e.g., a keyboard), a cursor control device (e.g., a mouse), and a signal generation device 720 (e.g., a speaker).

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A data buffer comprising:
a primary interface to be coupled to a memory controller; and
a secondary interface to be coupled to at least one dynamic random-access memory (DRAM) device, and wherein the data buffer is configured to:
receive a forwarded clock signal to sample data in a transaction between the data buffer and the at least one DRAM device;
communicate data to and from the memory controller on the primary interface using a strobe signal; and
communicate the data to and from the at least one DRAM device on the secondary interface using the forwarded clock signal.

2. The data buffer of claim 1; further comprising:
a first pair of flip-flops coupled to receive a data signal, during a read operation, from the at least one DRAM device on the secondary interface;
a first phase adjuster coupled to receive the forwarded clock signal from a buffer device, wherein the first phase adjuster is configured to control first samplings of the data signal at the first pair of flip-flops,
a second pair of flip-flops coupled to corresponding outputs of the first pair of flip-flops;
a delay-locked loop (DLL) configured to receive the forwarded clock signal from the buffer device;
a comparator coupled to an output of the first phase adjuster;
a second phase adjuster coupled to an output of the DLL and an output of the comparator, wherein the second phase adjuster is configured to control second samplings of the data signal at the second pair of flip-flops;
a first multiplexer coupled to outputs of the second pair of flip-flops and controlled by an output of the second phase adjuster, wherein the first multiplexer is configured to output the data signal to the memory controller on the primary interface; and
a second multiplexer configured to output the strobe signal to the memory controller on the primary interface based on clock timing of the second phase adjuster.

3. The data buffer of claim 2, wherein the first phase adjuster is configurable to calibrate a read transaction on the secondary interface, and wherein the second phase adjuster is configurable to calibrate data transfer between the first pair of flip-flops and the second pair of flip-flops with sufficient timing margin.

4. The data buffer of claim 3, wherein the data buffer is configured to receive a strobe signal from the memory controller via the primary interface, and wherein the strobe signal is not forwarded on the secondary interface by the data buffer.

5. The data buffer of claim 3, further comprising a buffer amplifier coupled to receive the forwarded clock signal from the buffer device, wherein the buffer amplifier is to provide an electrical impedance transformation between the buffer device and the data buffer.

6. The data buffer of claim 3, further comprising a buffer amplifier coupled to receive the data signal from the at least one DRAM device, wherein the buffer amplifier is to provide an electrical impedance transformation between the at least one DRAM device and the data buffer.

7. The data buffer of claim 6, further comprising a third phase adjuster coupled between the buffer amplifier and the first pair of flip-flops, wherein the first phase adjuster is configurable to calibrate a read transaction on the secondary interface, wherein the second phase adjuster is configurable to calibrate data transfer between the first pair of flip-flops and the second pair of flip-flops with sufficient timing margin, and wherein the third phase adjuster is configurable in a fixed phase state to account for voltage and timing variation of the first phase adjuster.

8. The data buffer of claim 3, further comprising a buffer amplifier coupled between the output of the second phase adjuster and control inputs of the second pair of flip-flops.

9. The data buffer of claim 1, wherein the forwarded clock signal is a differential signal.

10. The data buffer of claim 1, further comprising a delay-locked loop (DLL), wherein the DLL is configured to maintain a fixed latency across the data buffer.

11. A data buffer comprising:
a primary interface;
a secondary interface;
a first pair of flip-flops coupled to receive a data signal, during a read operation, from one of a plurality of dynamic random-access memory (DRAM) devices on the secondary interface;
a first phase adjuster coupled to receive a forwarded clock signal from a buffer device, wherein the first phase adjuster is configured to control first samplings of the data signal at the first pair of flip-flops,
a second pair of flip-flops coupled to corresponding outputs of the first pair of flip-flops;
a delay-locked loop (DLL) configured to receive the forwarded clock signal from the buffer device;
a comparator coupled to an output of the first phase adjuster;
a second phase adjuster coupled to an output of the DLL and an output of the comparator, wherein the second phase adjuster is configured to control second samplings of the data signal at the second pair of flip-flops;
a first multiplexer coupled to outputs of the second pair of flip-flops and controlled by an output of the second phase adjuster, wherein the first multiplexer is configured to output the data signal to a memory controller on the primary interface; and
a second multiplexer configured to output a strobe signal to the memory controller on the primary interface based on clock timing of the second phase adjuster.

12. The data buffer of claim 11, wherein the first phase adjuster is configurable to calibrate a read transaction on the secondary interface, and wherein the second phase adjuster is configurable to calibrate data transfer between the first pair of flip-flops and the second pair of flip-flops with sufficient timing margin.

13. The data buffer of claim 11, further comprising a third phase adjuster coupled to the first pair of flip-flops, wherein the first phase adjuster is configurable to calibrate a read transaction on the secondary interface, wherein the second phase adjuster is configurable to calibrate data transfer between the first pair of flip-flops and the second pair of flip-flops with sufficient timing margin, and wherein the third phase adjuster is configurable in a fixed phase state to account for voltage and timing variation of the first phase adjuster.

14. The data buffer of claim 11, further comprising a buffer amplifier coupled to receive the forwarded clock signal from the buffer device, wherein the buffer amplifier is to provide an electrical impedance transformation between the buffer device and the data buffer.

15. The data buffer of claim 11, further comprising a buffer amplifier coupled to receive the data signal from the one of the plurality DRAM devices, wherein the buffer amplifier is to provide an electrical impedance transformation between the one of the plurality of DRAM devices and the data buffer.

16. The data buffer of claim 11, wherein the plurality of DRAM devices are arranged in a rank, and wherein the forwarded clock signal is shared with the plurality of DRAM devices in the rank.

17. A data buffer comprising:
a primary interface;
a secondary interface;
a first pair of flip-flops coupled to receive a data signal from a memory controller on the primary interface, wherein the first pair of flip-flops is controlled by a strobe signal received from the memory controller on the primary interface;
a second pair of flip-flops coupled to receive the data signal from outputs of the first pair of flip-flops;
a delay-locked loop (DLL) configured to receive a forwarded clock signal from a buffer device; and
a phase adjuster coupled to an output of the DLL, wherein the phase adjuster is configured, in a write operation, to calibrate timing of the second pair of flip-flops such that the data signal output by the second pair of flip-flops on the secondary interface is sampled by at least one of a plurality of dynamic random-access memory (DRAM) devices in a middle of a sampling window.

18. The data buffer of claim 17, further comprising a comparator coupled to receive the strobe signal and an output of the phase adjuster, wherein the comparator is configured to provide a control signal to the memory controller that allows calibration of the strobe signal with respect to the write operation.

19. The data buffer of claim 17, further comprising:
a first buffer amplifier coupled to receive the data signal from the memory controller on the primary interface;
a second buffer amplifier coupled to receive the strobe signal from the memory controller on the primary interface; and
a third buffer amplifier coupled to receive the forwarded clock signal from the buffer device.

20. The data buffer of claim 17, wherein the plurality of DRAM devices are arranged in a rank, and wherein the forwarded clock signal is shared with the plurality of DRAM devices in the rank.

* * * * *